(12) United States Patent
Wang

(10) Patent No.: US 8,901,660 B2
(45) Date of Patent: Dec. 2, 2014

(54) SEMICONDUCTOR STRUCTURE AND FAULT LOCATION DETECTING SYSTEM

(75) Inventor: Wei Chih Wang, New Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 909 days.

(21) Appl. No.: 13/081,567

(22) Filed: Apr. 7, 2011

(65) Prior Publication Data
US 2012/0193532 A1    Aug. 2, 2012

(30) Foreign Application Priority Data

Feb. 1, 2011    (TW) .............................. 100103944 A

(51) Int. Cl.
*H01L 29/76*    (2006.01)
*H01L 21/66*    (2006.01)
*G01R 31/307*    (2006.01)

(52) U.S. Cl.
CPC .............. *H01L 22/34* (2013.01); *G01R 31/307* (2013.01)
USPC ....... 257/368; 257/48; 257/E29.255; 250/309

(58) Field of Classification Search
USPC ...................... 257/48, 368, E29.255; 250/309
See application file for complete search history.

(56) References Cited

U.S. PATENT DOCUMENTS

2012/0193532 A1*    8/2012    Wang ............................ 250/309

\* cited by examiner

*Primary Examiner* — Long Pham
(74) *Attorney, Agent, or Firm* — Rosenberg, Klein & Lee

(57) ABSTRACT

A semiconductor structure includes a grounding unit, a P-type substrate, a P-type well area, an NMOS structure, a P-type well contact area, a shallow trench isolation structure, and a charge guiding groove. The P-type substrate is formed above the grounding unit. The P-type well area is formed on the P-type substrate. The NMOS structure is formed on the P-type well area, and the NMOS structure includes at least one exposed N-type source area, at least one exposed N-type drain area, and at least one exposed N-type gate area. The P-type well contact area is formed on the P-type well area. The shallow trench isolation structure is disposed between the NMOS structure and the P-type well contact area. The charge guiding groove passes through the P-type well contact area and one part of the P-type well area and is electrically connected with the grounding unit.

1 Claim, 5 Drawing Sheets

SEMICONDUCTOR STRUCTURE AND FAULT LOCATION DETECTING SYSTEM

BACKGROUND OF THE INVENTION

1. Field of the Invention

The instant disclosure relates to a semiconductor structure and a fault location detecting system, and more particularly, to a semiconductor structure and a fault location detecting system for increasing the probability of generating reflected secondary electrons.

2. Description of Related Art

Each step in a memory manufacturing process has to undergo stringent quality control to produce a high and stable yield rate. When the yield rate drops below a normal standard, test engineers are called in to investigate the cause.

Bit-map memory test programs are one of the more commonly used programs to test physical memory. The testing parameters for the bit-map memory test program first have to be setup according to the physical address table provided by the memory manufacturer. The data output pattern from the memory test program is regarded as the electrical address, which is supposed to match the corresponding physical address in the physical memory. The output of the bit-map memory test program displayed on a screen is represented by a stream of 0 and 1 in a specific pattern.

During bit-map memory testing, test data is first written into the physical memory, and then the data is read out of memory. If the tested memory is a good memory chip, the results of the test program should correspond to the test data written into specified memory locations. If faulty memory addresses or memory cells exist in the physical memory, the data values at those memory locations cannot be read, causing the corresponding data image to be different from the data input into the memory. Through such comparison of FIB modeling results and the bit-map memory test results, whether or not the bit-map memory test detects all faulty memory address lines and data cells in a memory chip can thus be verified.

It is absolutely important that the physical memory address table provided by the memory manufacturer be a complete match with the physical memory address. Only then, can the memory test program based on the physical memory address table be successfully performed on the physical memory with high accuracy. It only takes a small data discrepancy in the physical memory to render the tested memory useless, because the test program is unable to test all physical memories to produce a clean test report. To prevent such errors during memory testing with the bit-map memory test program, a verification process is developed in the present invention by means of FIB (Focused Ion Beam) apparatus, which can tell how accurate and reliable a bit-map memory test program is.

Moreover, another way to test physical memory is the analysis of the passive voltage contrast. When the focused ion beams are projected onto a pre-test memory, the secondary electrons triggered by the FIB apparatus can be received to obtain image contrast value (shading value) of the pre-test memory, thus the fault location (the positions of bright and dark spots) can be detected by an electro microscope. However, the image contrast value on the NMOS area of the semiconductor structure can not be efficiently increased in the prior art.

SUMMARY OF THE INVENTION

One particular aspect of the instant disclosure is to provide a semiconductor structure and a fault location detecting system for increasing the probability of generating reflected secondary electrons, thus the reliability of executing the analysis of the passive voltage contrast is increased.

One embodiment of the instant disclosure provides a semiconductor structure, comprising: at least one grounding unit, at least one P-type substrate, at least one P-type well area, at least one NMOS structure, at least one P-type well contact area, at least one shallow trench isolation structure, and at least one charge guiding groove. The P-type substrate is formed above the grounding unit. The P-type well area is formed on the P-type substrate. The NMOS structure is formed on the P-type well area, and the NMOS structure includes at least one exposed N-type source area, at least one exposed N-type drain area, and at least one exposed N-type gate area disposed between the N-type source area and the N-type drain area. The P-type well contact area is formed on the P-type well area. The shallow trench isolation structure is disposed between the NMOS structure and the P-type well contact area. The charge guiding groove passes through the P-type well contact area and one part of the P-type well area and is electrically connected with the grounding unit.

Another embodiment of the instant disclosure provides a fault location detecting system, comprising: a semiconductor structure, an ion beam generating device, and an image capturing device. The semiconductor structure comprises at least one grounding unit, at least one P-type substrate, at least one P-type well area, at least one NMOS structure, at least one P-type well contact area, at least one shallow trench isolation structure, and at least one charge guiding groove, wherein the P-type substrate is formed above the grounding unit, the P-type well area is formed on the P-type substrate, the NMOS structure is formed on the P-type well area, the NMOS structure includes at least one exposed N-type source area, at least one exposed N-type drain area, and at least one exposed N-type gate area disposed between the N-type source area and the N-type drain area, the P-type well contact area is formed on the P-type well area, the shallow trench isolation structure is disposed between the NMOS structure and the P-type well contact area, and the charge guiding groove passes through the P-type well contact area and one part of the P-type well area and is electrically connected with the grounding unit. The ion beam generating device is disposed above the semiconductor structure, wherein at least one ion beam generated by the ion beam generating device is projected onto the semiconductor structure to form an ion layer with positive charges and trigger off a plurality of reflected surface electronic signals, the positive charges of the ion layer are formed on the top surface of NMOS structure, the top surface of the shallow trench isolation structure, and the inner surface of the charge guiding groove, and the positive charges of the ion layer are transmitted to the grounding unit through the charge guiding groove. The image capturing device is disposed above the semiconductor structure to receive the reflected surface electronic signals.

Another embodiment of the instant disclosure provides a fault location detecting system, comprising: a semiconductor structure, an ion beam generating device, and an image capturing device. The semiconductor structure comprises at least one P-type substrate, at least one N-type doping area, at least one P-type well area, at least one NMOS structure, at least one P-type well contact area, and at least one charge guiding groove, wherein the N-type doping area is formed on the P-type substrate, the P-type well area is formed on the N-type doping area, the NMOS structure is formed on the P-type well area, the NMOS structure includes at least one exposed N-type source area, at least one exposed N-type drain area, and at least one exposed N-type gate area disposed between the N-type source area and the N-type drain area, the P-type well contact area is formed on the N-type doping area, and the charge guiding groove passes through the P-type well contact area and one part of the N-type doping area and is disposed between the P-type well area and the P-type well contact area. The ion beam generating device is disposed above the semiconductor structure, wherein at least one ion beam generated by the ion beam generating device is projected onto the semiconductor structure to form an ion layer with positive charges and trigger off a plurality of reflected surface electronic signals, the positive charges of the ion layer are formed on the top surface of NMOS structure and the inner surface of the charge guiding groove, and the positive charges of the ion layer are transmitted to the N-type doping area through the charge guiding groove. The image capturing device is disposed above the semiconductor structure to receive the reflected surface electronic signals.

Therefore, the positive charges of the ion layer can be transmitted to the grounding unit through the charge guiding groove or the positive charges of the ion layer can be transmitted to the N-type doping area through the charge guiding groove, thus the probability of generating reflected secondary electrons can be increased efficiently in order to increase the reliability of executing the analysis of the passive voltage contrast.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

[First Embodiment]

Figure 1A:
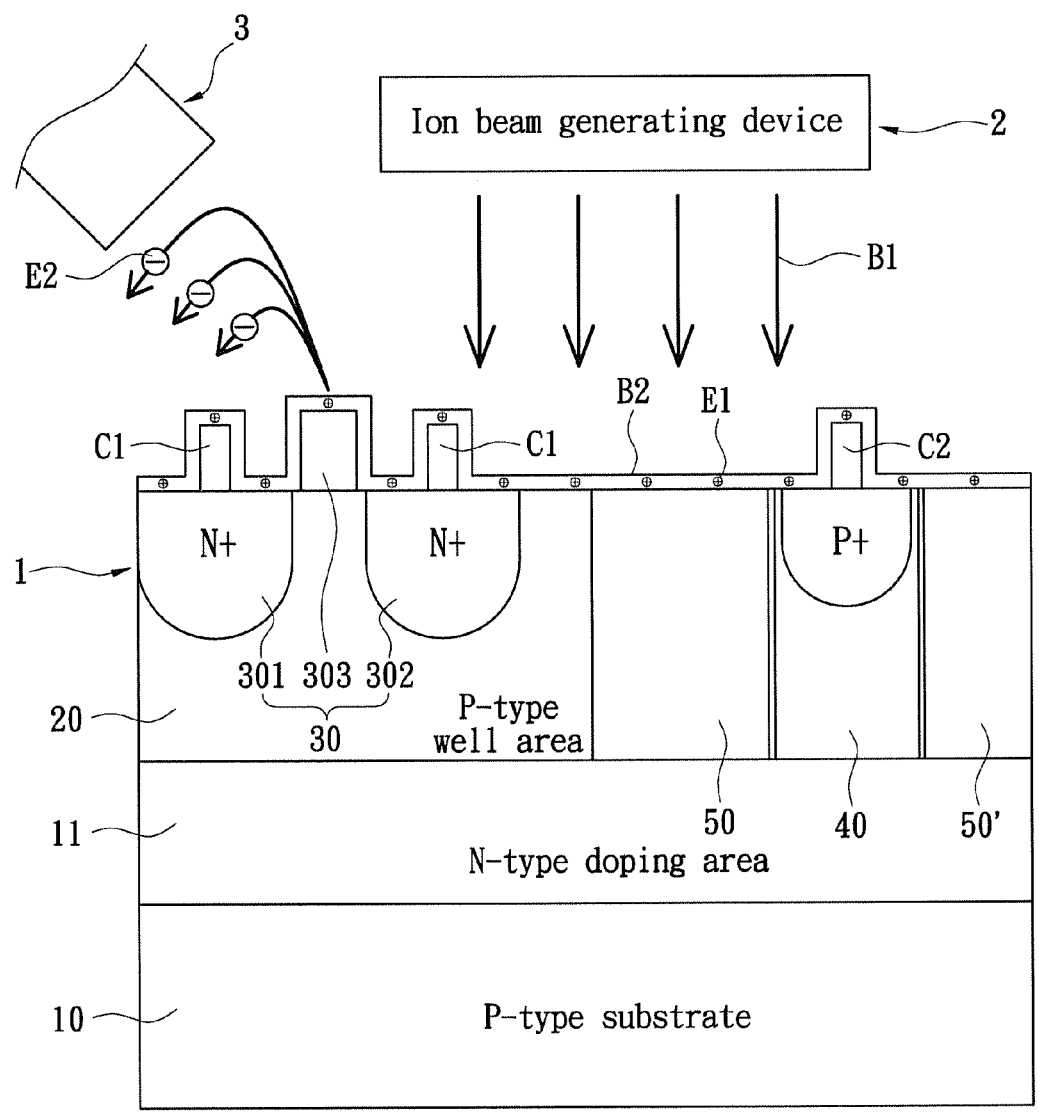
FIG. 1A shows a lateral, schematic view of the fault location detecting system without forming the charge guiding groove according to the first embodiment of the instant disclosure.
Figure 1B:
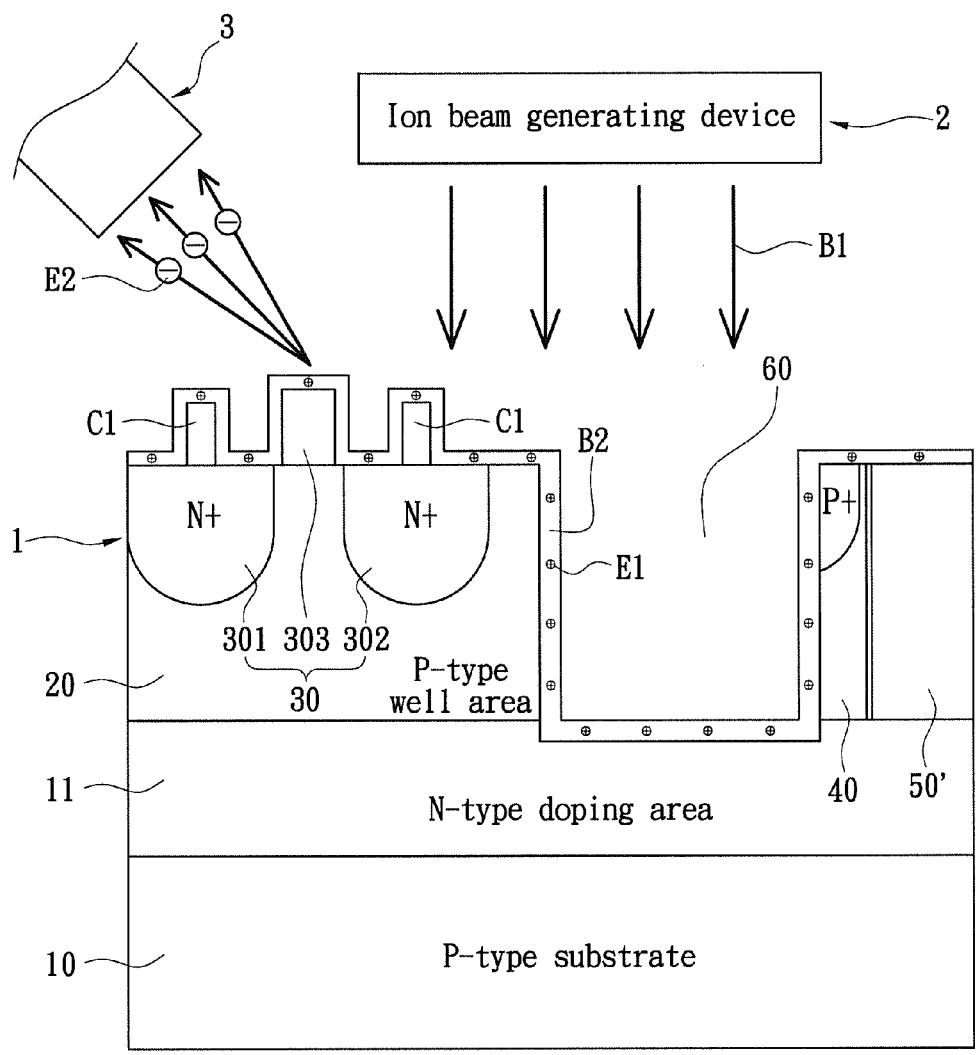
FIG. 1B shows a lateral, schematic view of the fault location detecting system with the charge guiding groove according to the first embodiment of the instant disclosure.

Referring to FIGS. 1A and 1B, where the first embodiment of the instant disclosure provides a fault location detecting system, comprising: a semiconductor structure 1, an ion beam generating device 2, and an image capturing device 3.

The semiconductor structure 1 comprises at least one P-type substrate 10, at least one N-type doping area 11, at least one P-type well area 20, at least one NMOS (N-type Metal-Oxide-Semiconductor) structure 30, at least one P-type well contact area 40, at least one shallow trench isolation (STI) structure 50, and at least one charge guiding groove 60 (as shown in FIG. 1B). In addition, the N-type doping area 11 is formed on the P-type substrate 10, and the P-type well area 20 is formed on the N-type doping area 11. The NMOS structure 30 is formed on the P-type well area 20, and the NMOS structure 30 includes at least one exposed N-type source area 301, at least one exposed N-type drain area 302, and at least one exposed N-type gate area 303 disposed between the N-type source area 301 and the N-type drain area 302. The NMOS structure 30 includes at least two N-type well contact point C1 respectively disposed on the N-type source area 301 and the N-type drain area 302. The P-type well contact area 40 is formed on the N-type doping area 11, and the P-type well contact area 40 has at least one P-type well contact potion C2. The shallow trench isolation structure 50 is disposed between the P-type well area 20 and the P-type well contact area 40. The charge guiding groove 60 (as shown in FIG. 1B) can be formed by gallium ion beams. The charge guiding groove 60 passes through the P-type well contact area 40, the shallow trench isolation structure 50, and one part of the N-type doping area 11 and is disposed between the P-type well area 20 and the P-type well contact area 40. Moreover, the semiconductor structure 1 further comprises at least one another shallow trench isolation structure 50', and the P-type well contact area 40 is formed between the two shallow trench isolation structures (50, 50') as shown in FIG. 1A.

The ion beam generating device 2 may be a FIB (Focused Ion Beam) disposed above the semiconductor structure 1. At least one ion beam B1 generated by the ion beam generating device 2 can be projected onto the semiconductor structure 1 to form an ion layer B2 with positive charges E1 (such as Gallium (G$^+$)) and trigger off a plurality of reflected surface electronic signals (such as secondary electrons) E2. After the charge guiding groove 60 has be finished (as shown in FIG. 1B), the positive charges E1 of the ion layer B2 are formed on the top surface of NMOS structure 30 and the inner surface of the charge guiding groove 60, and the positive charges E1 of the ion layer B2 can be transmitted to the N-type doping area 11 through the charge guiding groove 60.

The image capturing device 3 is disposed above the semiconductor structure 1 to receive the reflected surface electronic signals E2. For example, the image capturing device 3 may be an electro microscope for receiving and capturing the surface electronic signals E2 that have been triggered and reflected to execute the analysis of the passive voltage contrast.

Figure 1C:
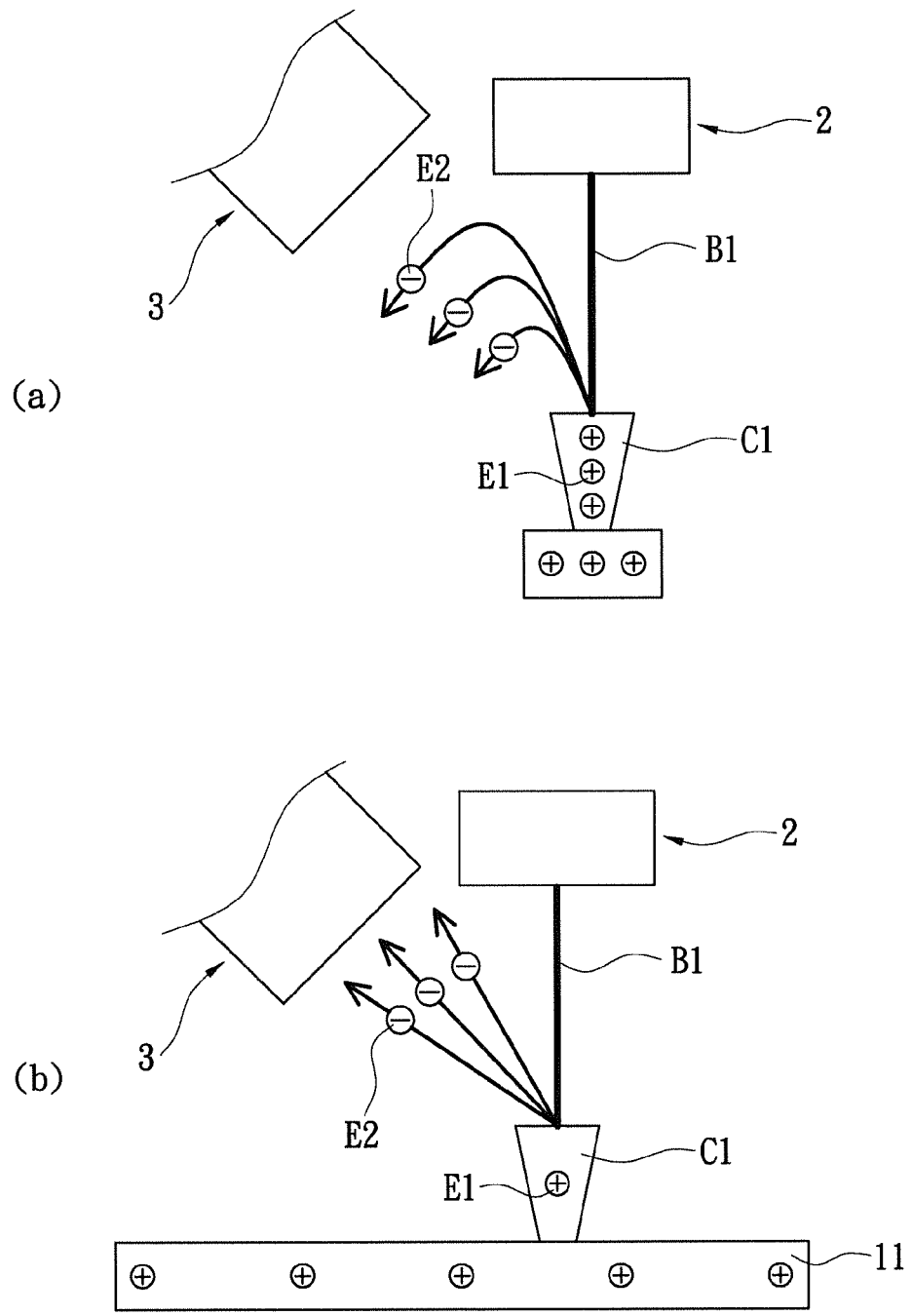
FIG. 1C shows a comparison diagrams of comparing the fault location detecting system without forming the charge guiding groove (FIG. 1C(a)) with the fault location detecting system with the charge guiding groove (FIG. 1C(b)) according to the first embodiment of the instant disclosure.

Referring to FIGS. 1A and 1C, when the charge guiding groove 60 has not been formed yet (as shown in FIG. 1A), the positive charges E1 are accumulated in the inner portion or on the outer surface of the N-type well contact point C1 (as shown in FIGS. 1A and 1C(a)). Therefore, the reflected surface electronic signals E2 are attracted easily by the accumulated positive charges E1 and can not be efficiently transmitted to the image capturing device 3, thus the image capturing device 3 can not obtain obvious image contrast value (shading value) to execute the analysis of the passive voltage contrast. Furthermore, referring to FIGS. 1B and 1C, when the charge guiding groove 60 has been formed (as shown in FIG. 1B), the positive charges E1 can be transmitted to the N-type doping area 11 due to the large accommodating space of the N-type doping area 11 (as shown in FIG. 1 C(b)). Therefore, the reflected surface electronic signals E2 can not be attracted easily by the small amount of the positive charges E1 and can be efficiently transmitted to the image capturing device 3, thus the image capturing device 3 can obtain obvious image contrast (shading value) to execute the analysis of the passive voltage contrast.

[Second Embodiment]

Figure 2A:
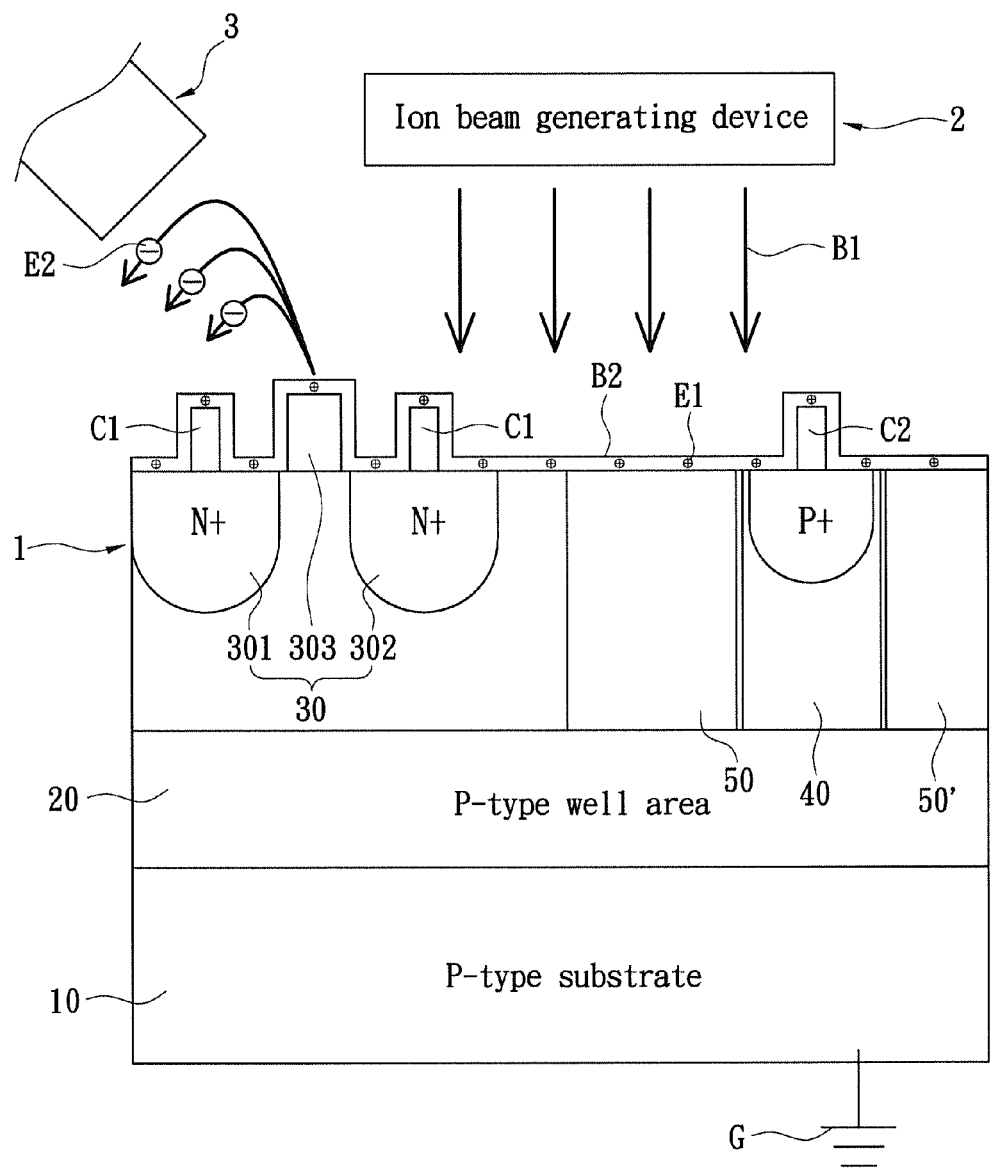
FIG. 2A shows a lateral, schematic view of the fault location detecting system without forming the charge guiding groove according to the second embodiment of the instant disclosure.
Figure 2B:
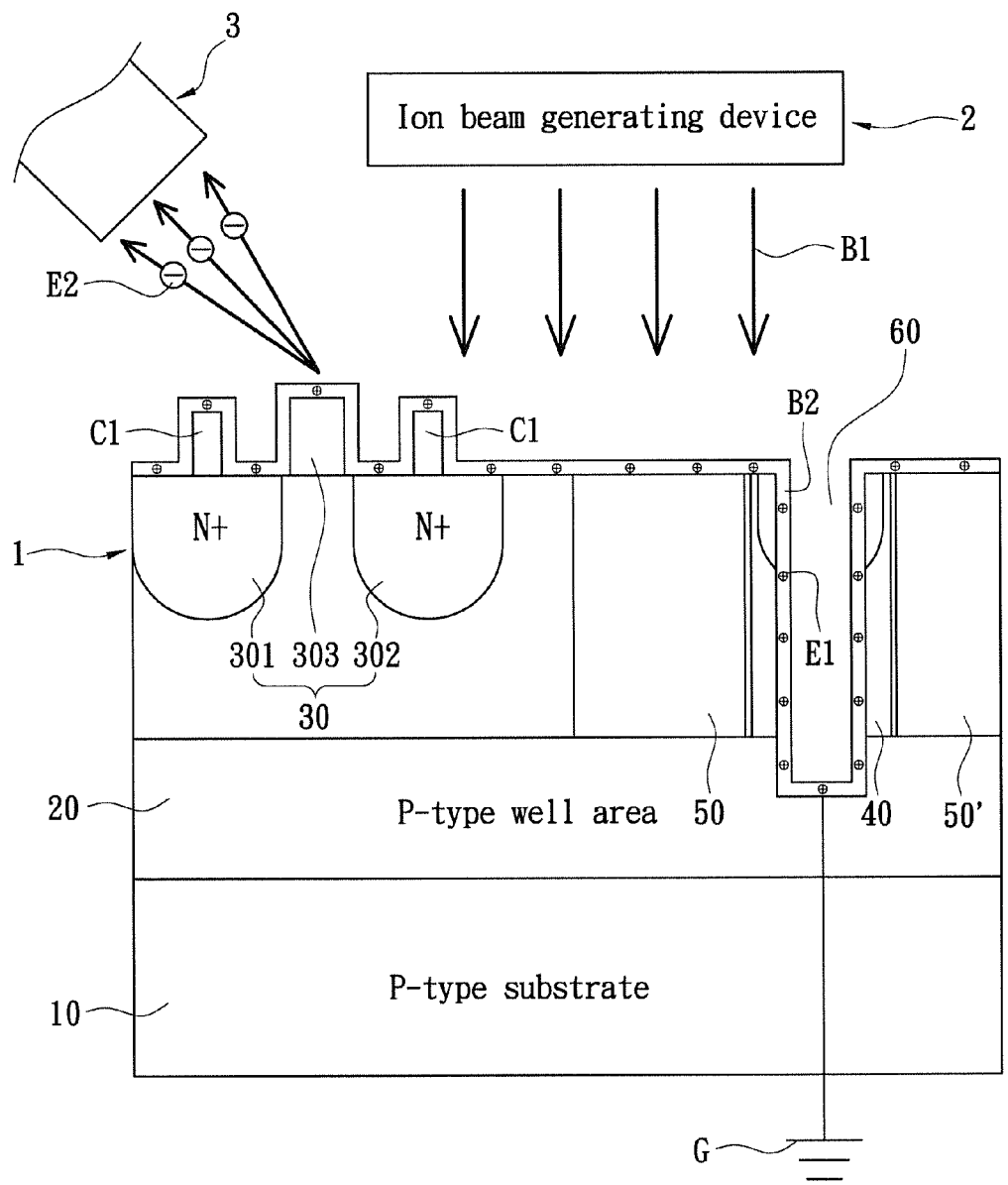
FIG. 2B shows a lateral, schematic view of the fault location detecting system with the charge guiding groove according to the second embodiment of the instant disclosure.

Referring to FIGS. 2A and 2B, where the second embodiment of the instant disclosure provides a fault location detecting system, comprising: a semiconductor structure 1, an ion beam generating device 2, and an image capturing device 3.

The semiconductor structure 1 comprises at least one grounding unit G, at least one P-type substrate 10, at least one P-type well area 20, at least one NMOS structure 30, at least one P-type well contact area 40, at least one shallow trench isolation structure 50, and at least one charge guiding groove 60. In addition, the grounding unit G may be a back-to-back diode. The P-type substrate 10 is formed above the grounding unit G. The P-type well area 20 is formed on the P-type substrate 10. The NMOS structure 30 is formed on the P-type well area 20, and the NMOS structure 30 includes at least one exposed N-type source area 301, at least one exposed N-type drain area 302, and at least one exposed N-type gate area 303 disposed between the N-type source area 301 and the N-type drain area 302. The NMOS structure 30 includes at least two N-type well contact point C1 respectively disposed on the N-type source area 301 and the N-type drain area 302. The P-type well contact area 40 is formed on the P-type well area 20, and the P-type well contact area 40 has at least one P-type well contact potion C2 (as shown in FIG. 2A). The shallow trench isolation structure 50 is disposed between the NMOS structure 30 and the P-type well contact area 40. The charge guiding groove 60 (as shown in FIG. 2B) can be formed by gallium ion beams. The charge guiding groove 60 passes through the P-type well contact area 40 and one part of the P-type well area 20 and is electrically connected with the grounding unit G (as shown in FIG. 2B).

Moreover, the semiconductor structure 1 further comprises at least one another shallow trench isolation structure 50', and the P-type well contact area 40 is formed between the two shallow trench isolation structures (50, 50') as shown in FIG. 2A.

The ion beam generating device 2 may be a FIB (Focused Ion Beam) disposed above the semiconductor structure 1. At least one ion beam B1 generated by the ion beam generating device 2 can be projected onto the semiconductor structure 1 to form an ion layer B2 with positive charges E1 (such as Gallium ($G^+$)) and trigger off a plurality of reflected surface electronic signals (such as secondary electrons) E2. After the charge guiding groove 60 has be finished (as shown in FIG. 1B), the positive charges E1 of the ion layer B2 are formed on the top surface of NMOS structure 30, the top surface of the shallow trench isolation structure 50, and the inner surface of the charge guiding groove 60, and the positive charges E1 of the ion layer B2 are transmitted to the grounding unit G through the charge guiding groove 60.

The image capturing device 3 is disposed above the semiconductor structure 1 to receive the reflected surface electronic signals E2. For example, the image capturing device 3 may be an electro microscope for receiving and capturing the surface electronic signals E2 that have been triggered and reflected to execute the analysis of the passive voltage contrast.

When the charge guiding groove 60 has not been formed yet (as shown in FIG. 2A), the positive charges E1 are accumulated in the inner portion or on the outer surface of the N-type well contact point C1. Therefore, the reflected surface electronic signals E2 are attracted easily by the accumulated positive charges E1 and can not be efficiently transmitted to the image capturing device 3, thus the image capturing device 3 can not obtain obvious image contrast (shading value) to execute the analysis of the passive voltage contrast. Furthermore, when the charge guiding groove 60 has been formed (as shown in FIG. 2B), the positive charges E1 can be transmitted to the grounding unit G Therefore, the reflected surface electronic signals E2 can not be attracted easily by the small amount of the positive charges E1 and can be efficiently transmitted to the image capturing device 3, thus the image capturing device 3 can obtain obvious image contrast (shading value) to execute the analysis of the passive voltage contrast.

In conclusion, the positive charges of the ion layer can be transmitted to the grounding unit through the charge guiding groove or the positive charges of the ion layer can be transmitted to the N-type doping area through the charge guiding groove, thus the probability of generating reflected secondary electrons can be increased efficiently in order to increase the reliability of executing the analysis of the passive voltage contrast.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A fault location detecting system, comprising:
a semiconductor structure comprising at least one P-type substrate, at least one N-type doping area, at least one P-type well area, at least one NMOS structure, at least one P-type well contact area, and at least one charge guiding groove, wherein the N-type doping area is formed on the P-type substrate, the P-type well area is formed on the N-type doping area, the NMOS structure is formed on the P-type well area, the NMOS structure includes at least one exposed N-type source area, at least one exposed N-type drain area, and at least one exposed N-type gate area disposed between the N-type source area and the N-type drain area, the P-type well contact area is formed on the N-type doping area, and the charge guiding groove passes through the P-type well contact area and one part of the N-type doping area and is disposed between the P-type well area and the P-type well contact area;
an ion beam generating device disposed above the semiconductor structure, wherein at least one ion beam generated by the ion beam generating device is projected onto the semiconductor structure to form an ion layer with positive charges and trigger off a plurality of reflected surface electronic signals, the positive charges of the ion layer are formed on the top surface of NMOS structure and the inner surface of the charge guiding groove, and the positive charges of the ion layer are transmitted to the N-type doping area through the charge guiding groove; and
an image capturing device disposed above the semiconductor structure to receive the reflected surface electronic signals.

* * * * *